(12) United States Patent
Nam

(10) Patent No.: US 8,552,427 B2
(45) Date of Patent: Oct. 8, 2013

(54) FUSE PART OF SEMICONDUCTOR DEVICE AND METHOD OF FABRICATING THE SAME

(75) Inventor: Sang-Yun Nam, Icheon-si (KR)

(73) Assignee: Hynix Semiconductor Inc. (KR)

( * ) Notice: Subject to any disclaimer, the term of this patent is extended or adjusted under 35 U.S.C. 154(b) by 249 days.

(21) Appl. No.: 12/344,178

(22) Filed: Dec. 24, 2008

(65) Prior Publication Data

US 2009/0250786 A1   Oct. 8, 2009

(30) Foreign Application Priority Data

Apr. 2, 2008 (KR) .................. 10-2008-0030561

(51) Int. Cl.
*H01L 21/82* (2006.01)

(52) U.S. Cl.
USPC 257/48; 257/529; 257/E23.149; 257/E23.15; 438/132; 438/333

(58) Field of Classification Search
USPC ............ 257/529, E23.149, E21.476, 48, 208, 257/209, 528, E23.15; 438/601, 132, 215, 438/281, 333, 597, 598
See application file for complete search history.

(56) References Cited

U.S. PATENT DOCUMENTS

| 5,519,658 A | * | 5/1996 | Uda et al. ............... 365/200 |
| 5,608,257 A | * | 3/1997 | Lee et al. ............... 257/529 |
| 6,259,146 B1 | * | 7/2001 | Giust et al. ............. 257/529 |
| 6,753,210 B2 | * | 6/2004 | Jeng et al. .............. 438/132 |

FOREIGN PATENT DOCUMENTS

| CN | 1214549 | | 4/1999 |
| CN | 1655351 | | 8/2005 |
| JP | 06-104338 | | 4/1994 |
| KR | 2000037990 A | * | 7/2000 |
| KR | 1020000037990 | | 7/2000 |
| KR | 2006091937 A | * | 8/2006 |
| KR | 100680414 | | 2/2007 |
| KR | 1020070036463 | | 4/2007 |
| KR | 1020070079804 | | 8/2007 |

OTHER PUBLICATIONS

Korean Office Action for Korean patent application No. 10-2008-0030561.
Korean Notice of Allowance for application No. 10-2008-0030561.
Chinese Patent Certificate and Granted Publication for 101552258 dated Dec. 7, 2011.

* cited by examiner

*Primary Examiner* — Ermias Woldegeorgis
(74) *Attorney, Agent, or Firm* — Lowe Hauptman Ham & Berner, LLP

(57) ABSTRACT

A fuse part of a semiconductor device includes an insulation layer over a substrate, and a fuse over the insulation layer, wherein the fuse includes a plurality of blowing pads for irradiating a laser beam and the plurality of blowing pads have laser coordinates different from one another.

10 Claims, 6 Drawing Sheets

US 8,552,427 B2

FUSE PART OF SEMICONDUCTOR DEVICE AND METHOD OF FABRICATING THE SAME

CROSS-REFERENCE TO RELATED APPLICATIONS

The present application claims priority of Korean patent application number 10-2008-0030561, filed on Apr. 2, 2008, which is incorporated herein by reference in its entirety.

BACKGROUND

The present disclosure relates to a semiconductor device, and more particularly, to a fuse part of a semiconductor device, and a method of fabricating the same.

When a semiconductor device is highly integrated, the semiconductor device includes a number of minute memory cells. Thus, there is a possibility that a defect occurs in a portion of the memory cells during the fabrication of the semiconductor device. Even when the defect occurs in only one of the memory cells, the corresponding semiconductor device is discarded as an inferior product.

In other words, even though a defect may occur in only a few memory cells out of the whole of a much larger number of memory cells in a semiconductor device, the entire semiconductor device is discarded to reduce a production yield.

Accordingly, a redundancy cell for replacing a defective cell is provided in a some semiconductor devices. Generally, the redundancy cell includes a spare row and a spare column in a particular cell array.

A process for replacing a defective cell will now be described in detail. The defective cell is selected through an electrical die sorting (EDS) of a semiconductor device in which a wafer processing is completed.

A corresponding fuse within a fuse box provided in a peripheral circuit region of the semiconductor device is cut by applying a laser beam irradiation. That is, a blowing pad of the corresponding fuse is laser-irradiated to burn an interconnection. In this manner, the defective cell is replaced with the redundancy cell. In situations where an address of the defective cell is inputted, the redundancy cell is accessed instead of the defective cell.

The process of replacing the defective cell with the redundancy cell is referred to as a laser repair process. Although the defect occurs in the portion of the memory cells, there is no need to stop using the semiconductor device. Therefore, the production yield of the semiconductor device can be improved.

FIG. 1 illustrates a fuse part of a related semiconductor device.

Referring to FIG. 1, a plurality of line type fuses 102 extending in the same direction are disposed over a fuse part 100. Each of fuses 102 includes one blowing pad 102A for irradiating a laser beam.

A laser repair process can be performed one time at each fuse. Even when the laser repair process fails in only one cell because an interconnection is not completely burned, or a residue of the fuse remains over a substrate, the corresponding semiconductor device must be discarded.

When thicknesses of a remaining oxide (ROX) layer remaining over the blowing pad 102A are different in accordance with wafer regions and lots due to a process parameter, the probability of failure of the laser repair process greatly increases. This in turn significantly reduces the yield of a semiconductor device fabricating process.

SUMMARY

One or more embodiments are a fuse part of a semiconductor device including a fuse with a plurality of blowing pads, and a method of fabricating the same.

Other objects and attendant advantages of one or more embodiments will become apparent to those of ordinary skill in the art from a reading of the following detailed description in conjunction with the accompanying drawings and appended claims.

In accordance with one or more embodiments, a fuse part of a semiconductor device includes an insulation layer over a substrate; and a fuse over the insulation layer, wherein the fuse includes a plurality of blowing pads for irradiating a laser beam and the plurality of blowing pads have laser coordinates different from one another.

In accordance with one or more embodiments, a fuse part of a semiconductor device includes an insulation layer over a substrate; and a fuse over the insulation layer, wherein the fuse includes a plurality of blowing pads for irradiating a laser beam, and the plurality of blowing pads have at least one stepped portion there-between.

In accordance with one or more embodiments, a method for fabricating a fuse of a semiconductor device includes forming an insulation layer over a substrate; and forming a fuse including a plurality of blowing pads for irradiating a laser beam over the insulation layer, wherein the plurality of blowing pads have laser coordinates different from one another.

In accordance with one or more embodiments, a method for fabricating a fuse of a semiconductor device includes forming an insulation layer over a substrate; and forming a fuse including a plurality of blowing pads for irradiating a laser beam over the insulation layer, wherein the plurality of blowing pads have at least one stepped portion there-between.

In accordance with one or more embodiments, a method for fabricating a fuse of a semiconductor device includes forming an insulation layer over a semiconductor substrate; etching at least one of regions of the insulation layer in which a plurality of blowing pads are to be formed to a certain thickness to form at least one stepped portion; and forming a fuse including the plurality of blowing pads along the stepped portion of the insulation layer over the insulation layer having the stepped portion.

BRIEF DESCRIPTION OF THE DRAWINGS

Various embodiments are illustrated by way of example, and not by limitation, in the figures of the accompanying drawings.

DESCRIPTION OF EMBODIMENTS

Figure 1:
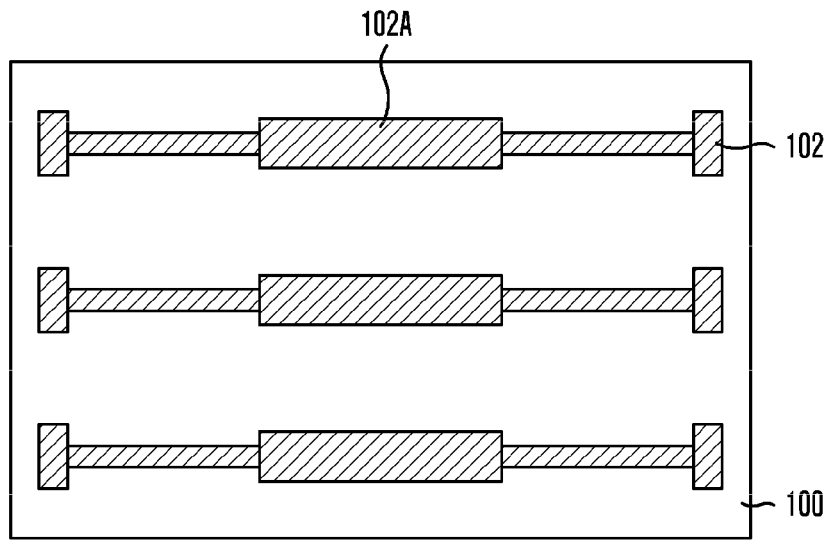
FIG. 1 illustrates a fuse part of a related semiconductor device.

Other objects and advantages of one or more embodiments can be understood by the following description, and become apparent with reference to the one or more embodiments. In the figures, the dimensions of layers and regions are exaggerated for clarity of illustration. It will also be understood that when a layer (or film) is referred to as being 'on' another layer or substrate, it can be directly on the other layer or substrate, or one or more intervening layers may also be present. Further, it will be understood that when a layer is referred to as being 'under' another layer, it can be directly under, or one or more intervening layers may also be present. In addition, it will also be understood that when a layer is referred to as being 'between' two layers, it can be the only layer between the two layers, or one or more intervening layers may also be between the other two layers. It is also noted that like reference numerals denote like elements throughout.

In one or more embodiments of a fuse part of a semiconductor device including a plurality of blowing pads and a method of fabricating the fuse part, the fuse includes three blowing pads. However, it is assumed for convenience of the following description, and one or more embodiments are not limited thereto.

Figure 2:
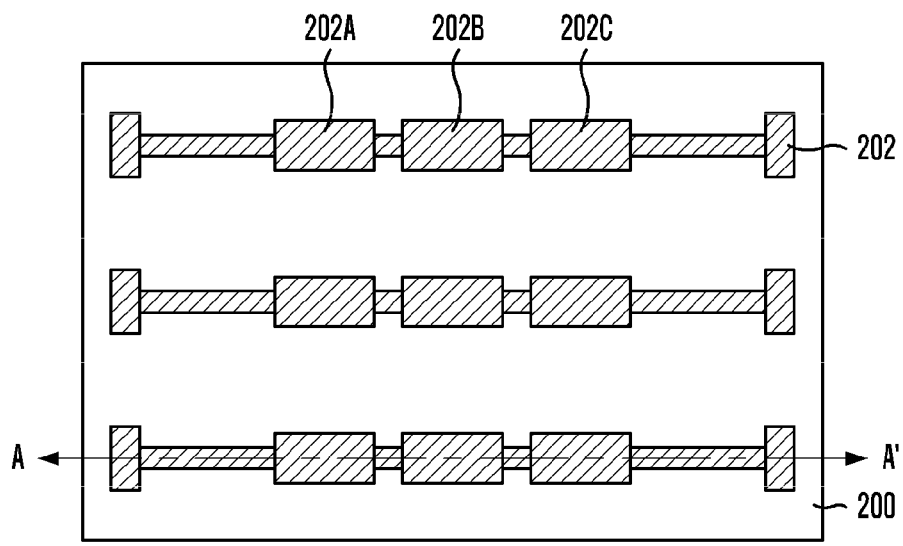
FIG. 2 illustrates a fuse part of a semiconductor device in accordance with one or more embodiments.

FIG. 2 illustrates a fuse part of a semiconductor device in accordance with one or more embodiments.

Referring to FIG. 2, a fuse part 200 includes a plurality of line type fuses 202 extending in a first direction A-A', spaced apart a certain distance from each other. The fuses 202 may be formed of metal interconnections.

Each of the fuses 202 includes a blowing region for irradiating a laser beam. A plurality of blowing pads 202A, 202B and 202C spaced apart by a certain distance from each other are disposed in the blowing region. The blowing pads 202A, 202B and 202C have laser coordinates different from one another.

Thus, the laser beam may be irradiated onto each of the blowing pads 202A, 202B and 202C until a laser repair process is successfully performed in one fuse 202. For example, in case where a first laser repair process fails in a first blowing pad 202A, a second laser repair process with respect to a second blowing pad 202B may be performed. Since more than one laser repair process can be performed, the probability of success of the laser repair process increases.

The plurality of blowing pads 202A, 202B and 202C may have the same area. Since the plurality of blowing pads 202A, 202B and 202C may have the same area, the probability of success of the laser repair process increases even if the laser repair processes are performed using the same laser spot size.

In addition, a repair etch process for forming a fuse box and a side wall polymer (SWP) etch process for preventing an edge portion of the fuse box from being cracked may be easily performed.

At least one stepped portion may exist between the plurality of blowing pads 202A, 202B and 202C. Specifically, stepped portions may exist at all portions between the plurality of blowing pads 202A, 202B and 202C.

Due to the stepped portions between the plurality of blowing pads 202A, 202B and 202C, thicknesses of a remaining insulation layer (not shown) remaining over each of the blowing pads 202A, 202B and 202C may become different from each other during a subsequent fuse box formation process.

Specifically, an insulation layer (not shown) is disposed over the fuse 202 including the plurality of blowing pads 202A, 202B and 202C in which the stepped portions exist therebetween. The insulation layer is selectively etched to form the fuse box. As a result, a remaining insulation layer having different thicknesses remains over the blowing pads 202A, 202B and 202C.

The remaining insulation layer may include an oxide layer. The oxide layer remaining over each of the blowing pads 202A, 202B and 202C is referred to as a remaining oxide layer.

Since the thicknesses of the remaining oxide layer remaining over the plurality of blowing pads 202A, 202B and 202C are different from each other, the probability of success of the laser repair process greatly increases even if the laser repair processes are performed using the same laser spot size.

FIGS. 3A to 3D illustrate a method of fabricating a fuse in accordance with an embodiment.

Figure 3A:
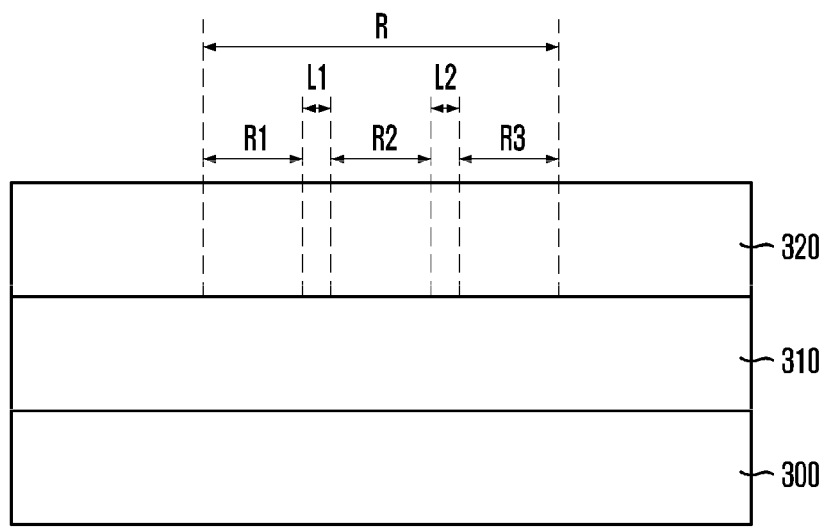
FIGS. 3A to 3D illustrate a method of fabricating a fuse in accordance with an embodiment.

Referring to FIG. 3A, a first insulation layer 310 is formed over a substrate 300 including lower structures (not shown) such as a device isolation layer and a transistor.

A conductive layer (not shown) for forming a fuse is deposited over the first insulation layer 310. The conductive layer may be formed of a material for a metal interconnection. The metal interconnection may be formed of aluminum (Al). An anti-reflective coating may be further formed over the conductive layer and a barrier metal may be further formed under the conductive layer.

The conductive layer for forming a fuse layer is selectively etched to form a line type fuse 320 extending in a first direction. The fuse 320 includes a blowing region R in which a laser beam is irradiated during a laser repair process. The blowing region R includes a plurality of blowing pad regions R1, R2 and R3 spaced certain distances L1 and L2 from each other. In one or more embodiments where three blowing pad regions R1, R2 and R3 are formed, a laser repair process can be performed up to three times. This increases the probability of success of the laser repair process.

Figure 3B:
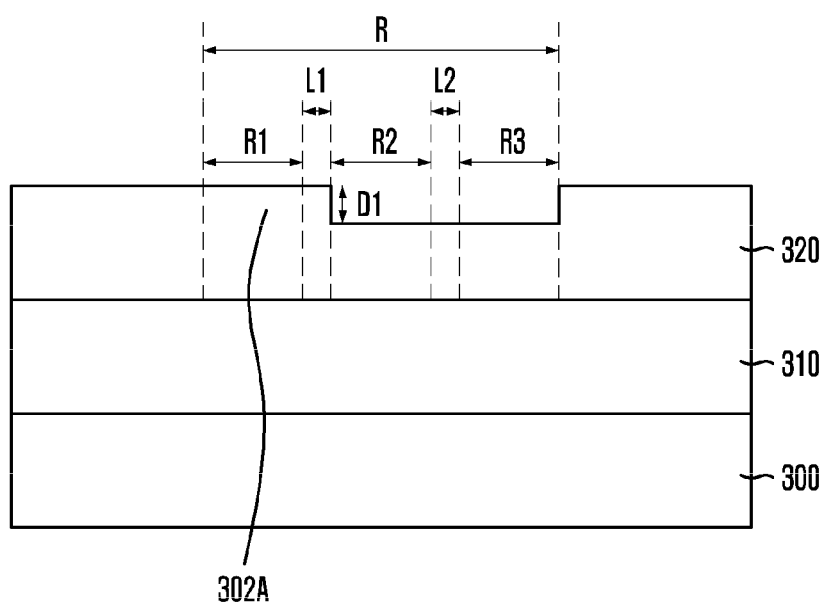
Figure 3C:
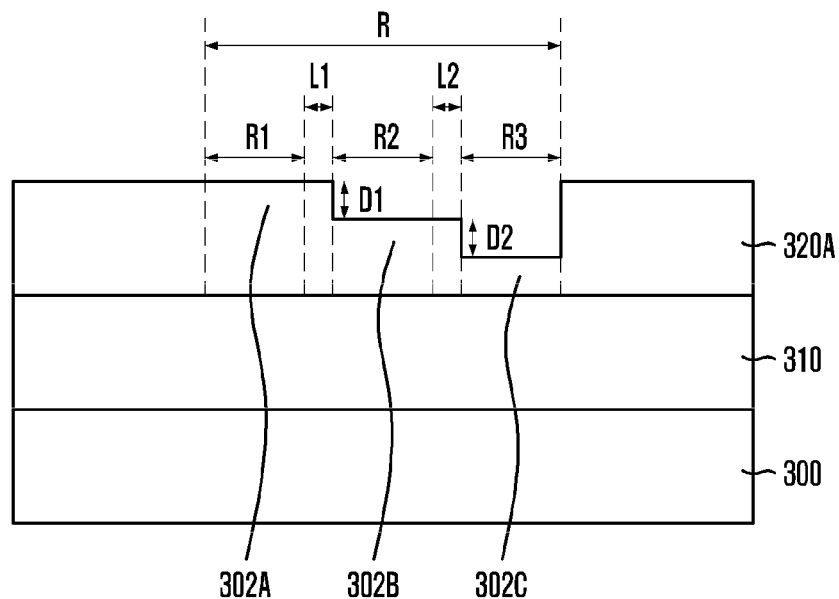

Referring to FIGS. 3B and 3C, at least one of the blowing pad regions R1, R2 and R3 of the fuse 320 is etched to a certain thickness D1 to form a stepped portion on a surface of the blowing region R, thereby forming a plurality of blowing pads. The plurality of blowing pads have at least one stepped portion. All of the plurality of blowing pads may have stepped portions. That is, the plurality of blowing pads may have thicknesses different from each other.

Referring to FIG. 3B, a primary etch process is performed on the fuse (reference numeral 320 of FIG. 3A) using a mask (not shown) covering the first blowing pad region R1 as an etch barrier to form a first blowing pad 302A. At this time, an etching depth D1 may range from approximately 500 Å to approximately 700 Å.

Referring to FIG. 3C, a secondary etch process is performed on the fuse 320A using a mask (not shown) covering the first blowing pad region R1 and the second blowing pad region R2 as an etch barrier to form a second blowing pad 302B and a third blowing pad 302C. At this time, an etching depth D2 may range from approximately 500 Å to approximately 700 Å.

As a result, there is formed a fuse 320A including the plurality of blowing pads 302A, 302B and 302C distinguished by surface stepped portions of the blowing region R. This configuration of the patterns of the mask described above is merely an example. It should be apparent that stepped portions having a variety of shapes and depths are formed using a mask having various patterns in one or more embodiments.

The first etching depth D1 may have the same depth as the second etching depth D2. Thus, the etch processes can be easily and repeatedly performed several times. Since the plurality of blowing pads 302C, 302B and 302C have the same area, subsequent repair etch and SWP etch processes can be easily performed.

Figure 3D:
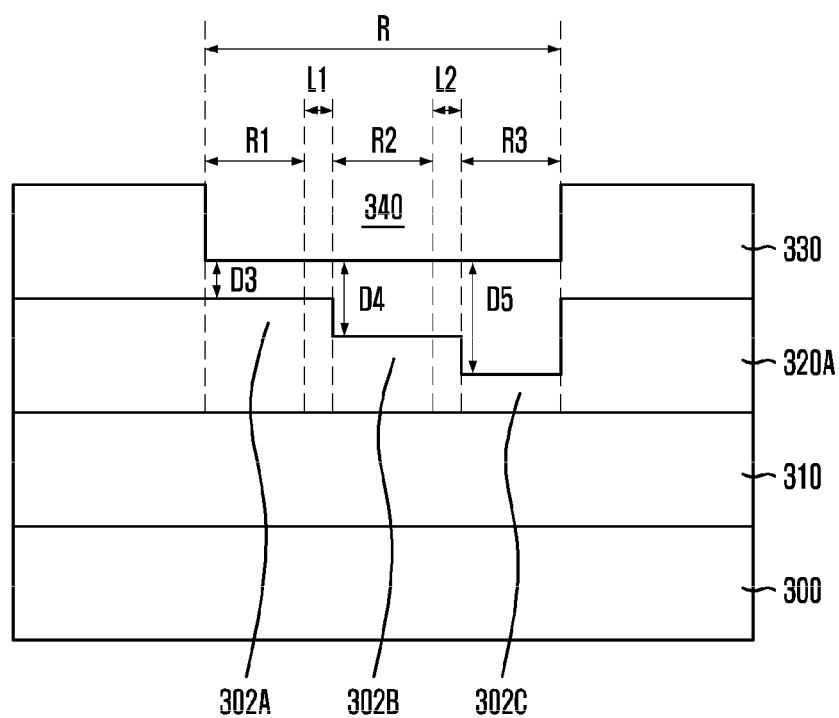

Referring to FIG. 3D, a second insulation layer (not shown) is formed over the resulting structure in which the fuse 320A including the plurality of blowing pads 302A, 302B and 302C is formed. The second insulation layer may include an oxide layer.

The second insulation layer formed over the fuse 320A is selectively etched to form a fuse box 340. In one or more embodiments where the fuse box 340 is formed, a stepped second insulation layer 330 having a certain thickness remains over the fuse 320A. The stepped second insulation layer 330 is referred to as a second remaining insulation layer 330.

Thicknesses D3, D4 and D5 of the second remaining insulation layer 330 remaining over the plurality of blowing pads 302A, 302B and 302C are different from each other due to the stepped portions between the plurality of blowing pads 302A, 302B and 302C formed under the second remaining insulation layer 330.

When a laser repair process with respect to each of the plurality of blowing pads 302A, 302B and 302C is performed, the probability of success of the laser repair process increases even if the laser repair process is performed using the same laser spot size.

For example, in case where the laser repair process has the highest yield when a second remaining insulation layer 330 having a thickness of approximately 3000 Å remains over the fuse 320A, the second remaining insulation layer 330 having a thicknesses of approximately 2,000 Å, approximately 3,000 Å and approximately 4,000 Å remains over the first blowing pad 302A, the second blowing pad 302B, and the third blowing pad 302C, respectively.

Although the thicknesses of the second remaining insulation layer 330 are not uniform due to process parameters, it is quite probable that the targeted second remaining insulation layer 330 having the thickness of approximately 3,000 Å remains because the thicknesses of the second remaining insulation layer 330 remaining over the three blowing pads 302A, 302B and 302C are different from each other. Thus, when the numbers of laser repair processes are performed, the yield of the laser repair process may further increase even if the laser repair processes are performed using the same laser spot size.

Figure 4:
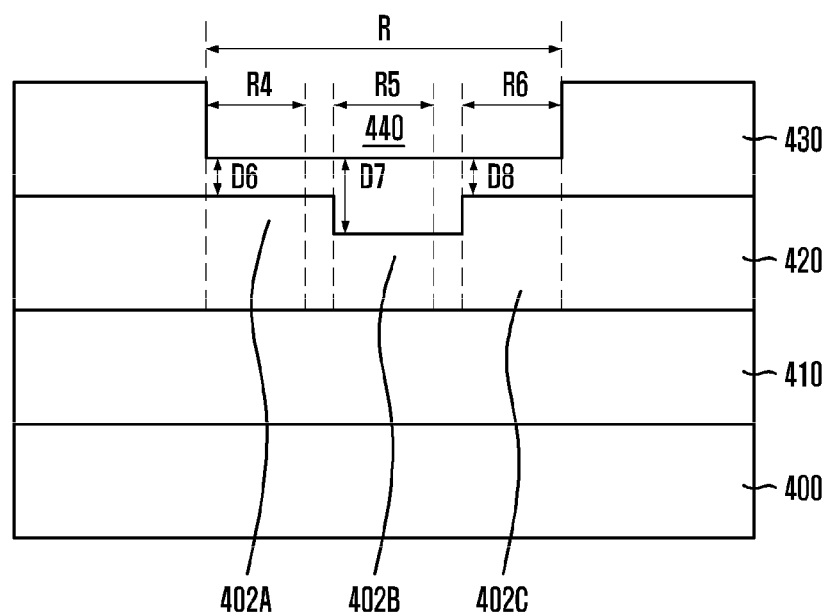
FIG. 4 illustrates a method of fabricating a fuse in accordance with one or more embodiments.

FIG. 4 illustrates a method of fabricating a fuse in accordance with one or more embodiments. A plurality of blowing pads have at least one stepped portion. A remaining insulation layer having the same thickness remains over a particular blowing pad.

Referring to FIG. 4, a first insulation layer 410 is formed over a substrate 400 including lower structures (not shown) such as a device isolation layer and a transistor.

A conductive layer (not shown) for forming a fuse is deposited over the first insulation layer 410. The conductive layer may be formed of a material for a metal interconnection. The metal interconnection may be formed of Al. An anti-reflective coating may be further formed over the conductive layer and a barrier metal may be further formed under the conductive layer.

The conductive layer is selectively etched to form a line type fuse (not shown) extending in a first direction. The fuse includes a blowing region R in which a laser beam is irradiated during a laser repair process. The blowing region R includes a plurality of blowing pad regions R4, R5 and R6 spaced certain distances from each other.

The fuse is etched using a mask covering the fourth blowing pad region R4 and the sixth blowing pad region R6 as an etch barrier to form a fuse 420 including a fourth blowing pad 402A, a fifth blowing pad 402B, and a sixth blowing pad 402C. At this time, an etching depth may range from approximately 500 Å to approximately 700 Å.

A second insulation layer (not shown) is formed over the resulting structure including the fuse 420. The second insulation layer formed over the fuse 420 is selectively etched to a fuse box 440.

Thus, a second remaining insulation layer 430 having certain thicknesses D6, D7 and D8 in accordance with the stepped portion of the fuse 420 remains over the fuse 420. That is, the second remaining insulation layer 430 having the same thickness D6 and D8, respectively, remains over the fourth blowing pad 402A and the sixth blowing pad 402C of the plurality of blowing pads 402A, 402B and 402C. The second remaining insulation layer 430 having the thickness D7 remains over the fifth blowing pad 402B, and D7 is greater than D6 and D8.

FIGS. 5A to 5D illustrate a method of fabricating a fuse in accordance with another embodiment.

Figure 5A:
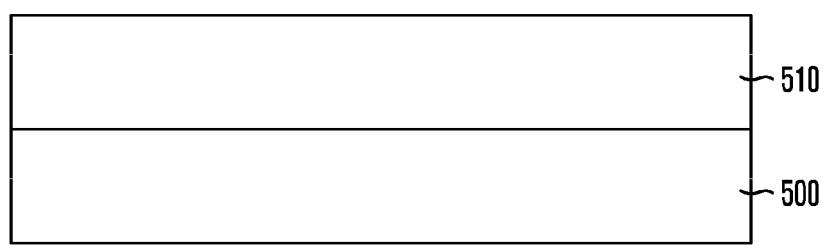
FIGS. 5A to 5D illustrate a method of fabricating a fuse in accordance with another embodiment.

Referring to FIG. 5A, a first insulation layer 510 is formed over a substrate 500 including lower structures (not shown) such as a device isolation layer and a transistor.

Figure 5B:
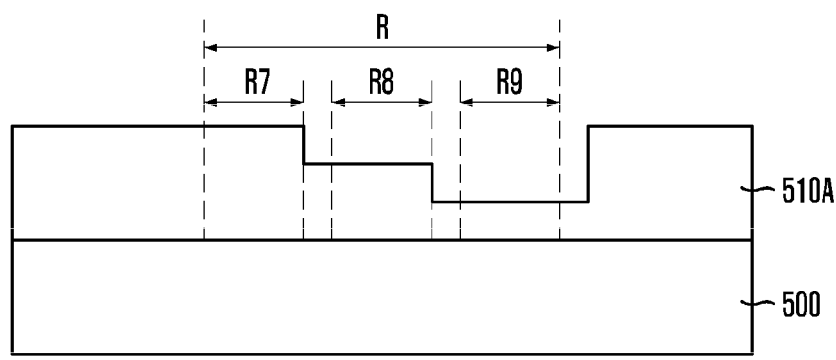

Referring to FIG. 5B, at least one of regions R7, R8 and R9 in which a plurality of blowing pads are to be formed through a subsequent process is etched by a certain thickness to form at least one stepped portion on a surface of the first insulation layer 510.

In the specific example depicted, a primary etch process is performed on the first insulation layer 510 using a mask covering a region R7 in which a seventh blowing pad region is to be formed as an etch barrier to form a stepped portion. At this time, an etching depth may range from approximately 500 Å to approximately 700 Å.

A secondary etch process is performed on a first remaining insulation layer (not shown) that is primarily etched using a mask covering regions R7 and R8 in which the seventh blowing pad region and an eighth blowing pad region are to be formed as an etch barrier to form another stepped portion. At this time, an etching depth may range from approximately 500 Å to approximately 700 Å.

As a result, there are formed a plurality of blowing pad regions R7, R8 and R9 each distinguished by surface stepped portions. At this time, since the primary etch process and the secondary etch process are performed with the same etching depth, the repeated etch process can be easily performed. A reference numeral 510A represents a first remaining insulation layer.

Figure 5C:
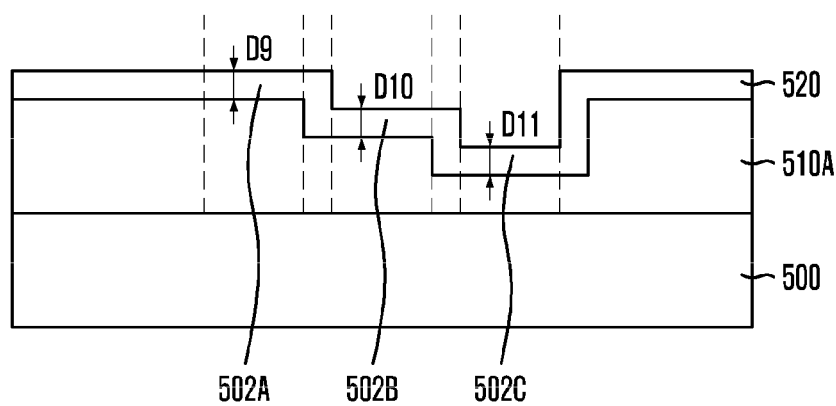

Referring to FIG. 5C, a conductive layer (not shown) for forming a fuse is deposited over a whole surface of the first remaining insulation layer 510A that is secondarily etched and has the stepped portions. The conductive layer is formed along the stepped portions of the secondary remaining insulation layer 510A. The conductive layer may be formed of Al. An anti-reflective coating may be further formed over the conductive layer and a barrier metal may be further formed under the conductive layer.

The conductive layer is selectively etched to form a plurality of line type fuses 520 extending in a first direction. As a result, there is formed the fuse 520 including a plurality of blowing pads 502A, 502B and 502C distinguished by the surface stepped portions of the corresponding blowing region R.

In one or more embodiments, the plurality of blowing pads 502A, 502B and 502C have at least one stepped portion. In one or more embodiments including the depicted embodiment, all of the plurality of blowing pads 502A, 502B and 502C may have stepped portions, respectively.

Figure 5D:
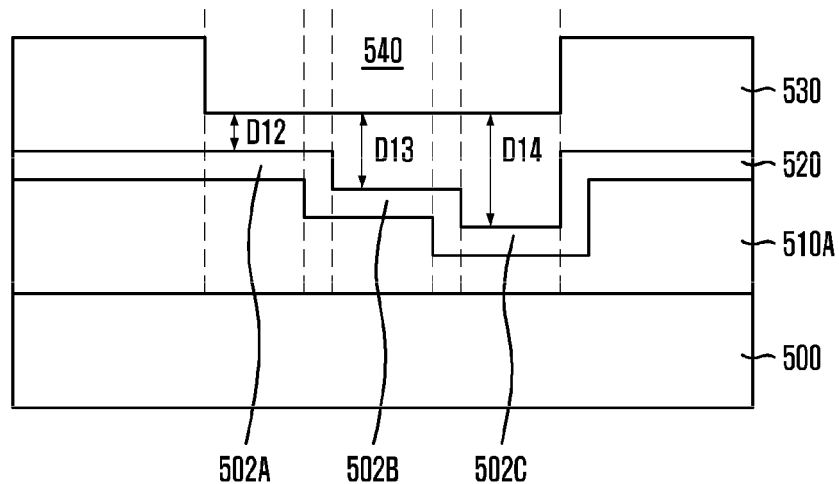

Referring to FIG. 5D, a second insulation layer (not shown) is formed over the resulting structure including the fuse 520. The second insulation layer formed over the fuse 520 is selectively etched to form a fuse box 540. Since the fuse box 540 is formed, a stepped second insulation layer 530 having a certain thickness remains over the fuse 520. The stepped second insulation layer 530 is referred to as a second remaining insulation layer 530.

Thicknesses D12, D13 and D14 of the second remaining insulation layer 530 remaining over the plurality of blowing pads 502A, 502B and 502C are different from each other due to the stepped portions between the plurality of blowing pads 502A, 502B and 502C formed under the second remaining insulation layer 530.

Thus, when a laser repair process with respect to each of the plurality of blowing pads 502A, 502B and 502C is performed, the probability of success of the laser repair process increases even if the laser repair process is performed using the same laser spot size.

Figure 6:
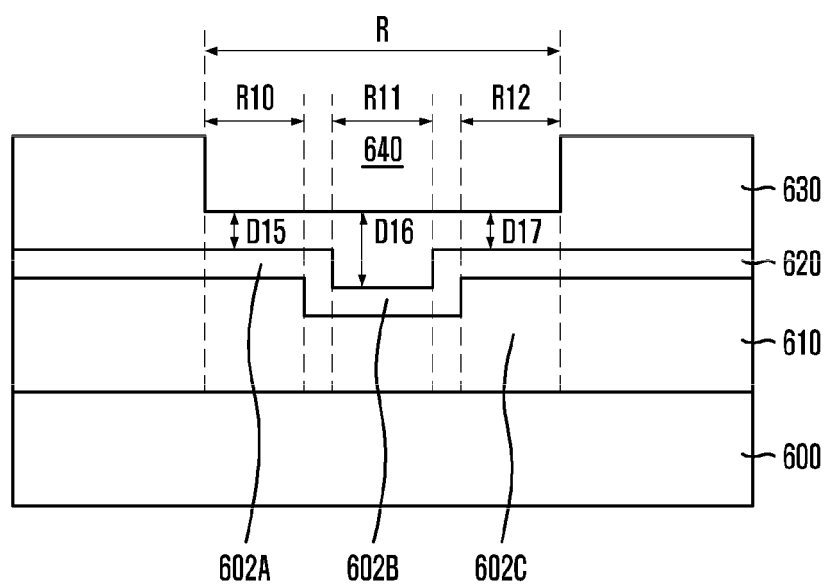
FIG. 6 illustrates a method of fabricating a fuse of a semiconductor device in accordance with one or more embodiments.

FIG. 6 illustrates a method of fabricating a fuse of a semiconductor device in accordance with one or more embodiments. A plurality of blowing pads each have at least one stepped portion. A remaining insulation layer having the same thickness remains over a particular blowing pad.

Referring to FIG. 6, a first insulation layer (not shown) is formed over a substrate 600 including lower structures (not shown) such as a device isolation layer and a transistor.

At least one of regions in which a plurality of blowing pads of a fuse are to be formed through a subsequent process is etched to form at least one stepped portion on a surface of the first insulation layer.

Specifically, a primary etch process is performed on the first insulation layer using a mask covering regions R10 and R12 in which a tenth blowing pad region and a twelfth blowing pad region are to be formed as an etch barrier to form a stepped portion on the surface of the first insulation layer.

A conductive layer (not shown) for forming a fuse is deposited over a whole surface of a first remaining insulation layer 610 having the stepped portion. The conductive layer is formed along a surface of the stepped portion of the first remaining insulation layer 610. The conductive layer may be formed of a material for a metal interconnection. The metal interconnection may be formed of Al. An anti-reflective coating may be further formed over the conductive layer and a barrier metal may be further formed under the conductive layer.

The conductive layer is selectively etched to form a line type fuse 620 extending in a first direction. As a result, there is formed the fuse 620 including a plurality of blowing pads 602A, 602B and 602C and having at least one stepped portion.

A second insulation layer (not shown) is formed over the resulting structure including the fuse 620. The second insulation layer formed over the fuse 620 is selectively etched to form a fuse box 640. Since the fuse box 640 is formed, a second remaining insulation layer 630 having certain thicknesses remains over the fuse 620.

The second remaining insulation layer 630 having the certain thicknesses D15, D16 and D17 in accordance with the stepped portion of the fuse 620 remains over the fuse 620. That is, the second remaining insulation layer 630 having the same thicknesses D15 and D17, respectively, remains over portions 602A and 602C of the plurality of blowing pads 602A, 602B and 602C. The second remaining insulation layer 630 having thickness D16 remains over portion 602B, and D16 is greater than both D15 and D17.

As described above, there is formed the fuse part of the semiconductor device including the fuse with the plurality of blowing pads. Thus, a plurality of laser repair processes can be performed in one cell.

Furthermore, the stepped portions exist between the plurality of blowing pads, and the remaining insulation layer formed over each of the blowing pads has different thicknesses corresponding in number to the number of unique stepped portions formed in the plurality of blowing pads. Therefore, a plurality of laser repair processes can be efficiently performed.

While one or more specific embodiments have been described, it will be apparent to those skilled in the art that various changes and modifications may be made.

What is claimed is:

1. A fuse part of a semiconductor device, the fuse part comprising:
an insulation layer over a substrate, the insulation layer having a flat upper surface; and a fuse over the insulation layer, the fuse comprising:
a plurality of blowing pads over the flat upper surface of the insulation layer for receiving a laser beam, each of the plurality of blowing pads having an upper surface, and the upper surfaces of the plurality of blowing pads having different distance to the flat upper surface; and
a connecting region between two of the plurality of blowing pads,
wherein the connecting region is substantially level with only one of the two of the plurality of blowing pads.

2. The fuse part of claim 1, wherein a difference between the heights of the two of the plurality of blowing pads ranges from approximately 500 Å to approximately 700 Å.

3. The fuse part of claim 1, wherein the plurality of blowing pads have the same area.

4. The fuse part of claim 1, wherein the laser beam is irradiated onto each of the plurality of blowing pads until a laser repair process with respect to the fuse is successfully performed.

5. The fuse part of claim 1, wherein the laser beam irradiated onto each of the plurality of blowing pads has the same laser spot size.

6. The fuse part of claim 1, wherein the fuse comprises a metal interconnection.

7. A semiconductor structure comprising:
a substrate;
a first insulation layer over the substrate;
a fuse over the first insulation layer, the fuse comprising:
    a first blowing pad having a first upper surface;
    a second blowing pad having a second upper surface;
    a first connecting region connecting the first blowing pad and the second blowing pad, the first connecting region having a third upper surface that is level with the first upper surface;
    a third blowing pad having a fourth upper surface; and
    a second connecting region connecting the second blowing pad and the third blowing pad, the second connecting region having a fifth upper surface that is level with the second upper surface; and
a second insulation layer over the first blowing pad, the second blowing pad, and the first connecting region, a first distance from a surface of the second insulation layer to the first upper surface being less than a second distance from the surface of the second insulation layer to the second upper surface, and a third distance from the surface of the second insulation layer to the fourth upper surface being greater than the second distance from the surface of the second insulation layer to the second upper surface.

8. The semiconductor structure of claim 7, wherein the first insulation layer comprises three stepped surfaces defining a stepped portion, and each of the first blowing pad, the second blowing pad, and the third blowing pad is over a corresponding one of the three stepped surfaces.

9. The semiconductor structure of claim 7, wherein a difference between the first upper surface and the second upper surface ranges from approximately 500 Å to approximately 700 Å.

10. The semiconductor structure of claim 7, wherein the first blowing pad and the second blowing pad have the same area.

* * * * *